(12) United States Patent
Peroni et al.

(10) Patent No.: US 9,577,064 B2
(45) Date of Patent: Feb. 21, 2017

(54) HIGH ELECTRON MOBILITY TRANSISTORS WITH FIELD PLATE ELECTRODE

(75) Inventors: Marco Peroni, Rome (IT); Paolo Romanini, Rome (IT)

(73) Assignee: SELEX ES S.P.A., Rome (IT)

( * ) Notice: Subject to any disclaimer, the term of this patent is extended or adjusted under 35 U.S.C. 154(b) by 271 days.

(21) Appl. No.: 13/813,337

(22) PCT Filed: Aug. 2, 2011

(86) PCT No.: PCT/IB2011/053439
§ 371 (c)(1),
(2), (4) Date: Apr. 8, 2013

(87) PCT Pub. No.: WO2012/017390
PCT Pub. Date: Feb. 9, 2012

(65) Prior Publication Data
US 2013/0193487 A1    Aug. 1, 2013

(30) Foreign Application Priority Data
Aug. 2, 2010  (IT) .............................. TO2010A0670

(51) Int. Cl.
H01L 29/66      (2006.01)
H01L 29/40      (2006.01)
(Continued)

(52) U.S. Cl.
CPC ....... *H01L 29/66431* (2013.01); *H01L 29/402* (2013.01); *H01L 29/405* (2013.01);
(Continued)

(58) Field of Classification Search
CPC .......................... H01L 29/402; H01L 29/0619
(Continued)

(56) References Cited

U.S. PATENT DOCUMENTS

| 6,984,853 B2 * | 1/2006 | Park .............................. 257/194 |
| 2007/0215899 A1 | 9/2007 | Herman |

(Continued)

FOREIGN PATENT DOCUMENTS

| EP | 2015353 A1 | 1/2009 |
| WO | WO-2008101989 A1 | 8/2008 |
| WO | WO-2009038809 A1 | 3/2009 |

OTHER PUBLICATIONS

Ventury et al., "performance and RF Reliability of GaN-on-SiC Hemt's using Dual-Gate Architectures", Microwave Symposium Digest, 2006.*

(Continued)

*Primary Examiner* — Allen Parker
*Assistant Examiner* — Frederick B Hargrove
(74) *Attorney, Agent, or Firm* — Marshall, Gerstein & Borun LLP

(57) ABSTRACT

A high electron mobility transistor comprising:
  an epitaxial substrate comprising a semi-insulating substrate, a buffer layer and a barrier layer sequentially stacked;
  a first and a second current conducting electrode formed on, and in ohmic contact with, the barrier layer;
  a control gate and one or more field plate electrode(s) formed on, and in contact with, the barrier layer between the first and second current conducting electrodes; and
  an electric circuit formed for electrically connecting each field plate electrode to an electric reference potential and comprising at least a rectifying contact and/or an electric resistor, wherein the rectifying contact is formed outside the channel area of the high electron (Continued)

mobility transistor and is distinguished from the rectifying contact formed by the corresponding field plate electrode.

22 Claims, 6 Drawing Sheets

(51) Int. Cl.
   *H01L 29/423* (2006.01)
   *H01L 29/778* (2006.01)
(52) U.S. Cl.
   CPC ...... *H01L 29/42316* (2013.01); *H01L 29/778* (2013.01); *H01L 29/7787* (2013.01)
(58) Field of Classification Search
   USPC .................................................. 257/190–195
   See application file for complete search history.

(56) References Cited

U.S. PATENT DOCUMENTS

| | | | |
|---|---|---|---|
| 2008/0191216 A1* | 8/2008 | Machida | H01L 25/18 257/76 |
| 2008/0277692 A1* | 11/2008 | Saito et al. | 257/192 |
| 2010/0155720 A1* | 6/2010 | Kaneko | 257/43 |
| 2010/0259329 A1* | 10/2010 | Tserng et al. | 330/277 |
| 2011/0221011 A1* | 9/2011 | Bahat-Treidel et al. | 257/409 |

OTHER PUBLICATIONS

Vetury, R., et al., "Performance and RF Reliability of GaN-on-SiC HEMT's Using Dual-Gate Architectures," *Microwave Symposium Digest*, IEEE MTT-S International, IEEE, PI, Jun. 1, 2006, pp. 714-717.
International Search Report in international application No. PCT/IB2011/053439, dated Dec. 9, 2011.

* cited by examiner

HIGH ELECTRON MOBILITY TRANSISTORS WITH FIELD PLATE ELECTRODE

CROSS-REFERENCE TO RELATED APPLICATIONS

This application claims the benefit of International Patent Application No. PCT/IB2011/053439, filed Aug. 2, 2011, which claims the benefit of Italian Patent Application No.: TO2010A 000670, filed Aug. 2, 2010.

TECHNICAL FIELD OF THE INVENTION

The present invention relates to Metal-Semiconductor Field Effect Transistors (MESFETs) in general and to High Electron Mobility Transistors (HEMTs) with field plate electrode in particular.

STATE OF THE ART

It is known that MESFETs are a particular type of field effect transistors in which the gate junction is constituted by a metal-semiconductor junction, also known as Schottky junction, unlike junction field effect transistors (JFETs), in which the gate junction consists of a p-n semiconductor junction, or metal-oxide-semiconductor field effect transistors (MOSFETs), in which a dielectric layer (generally made of Silicon Oxide) is interposed between the control gate and the semiconductor. MESFETs are normally made with composite semiconductors as GaAs, InP or SiC and are faster than JFETs or MOSFETs made of silicon by virtue of the higher electron mobility of such materials, although the first are more costly than the latter. MESFETs can operate up to frequencies of approximately 45 GHz, and are thus components often used for constructing integrated microwave circuits.

It is equally known that the Monolithic Microwave Integrated Circuits (MMICs) used in high-power and/or high-frequency applications are called to perform various radio frequency (RF) functions, such as switching, low noise amplification and power amplification, as, for example, required by front-ends transmission and reception modules operating in the frequency band from microwaves to millimetric waves, in both narrowband and broadband.

The electric features of the semiconductor material of which the MESFETs are made, are beyond doubt of primary importance among the features which have greater incidence on MESFET performance. Thus, the growing market demand for MMICs with increasingly better performance features has pointed the electronic industry towards heterostructure, high electron mobility MESFETs commonly named HEMTs, the electric features of which are such to allow such a growing demand to be satisfied. However, the different required MMIC RF functions imply implementation needs which may be even very different, the satisfaction of which requires the use of HEMTs with equally different performance.

Thus, the different RF functions that the integrated circuits may be called to perform, such as the development of new RF functions, inevitably imply the use of semiconductor material layers of different thickness, composition and doping features made so as to obtain the desired electric features of the HEMT. Because the HEMT manufacturing process is bound to the features of the original semiconductor material, the different features mentioned above consequently imply the adoption or development of different HEMT manufacturing processes.

Furthermore, some applications may require that a same MMIC implements different RF functions. In these applications, the HEMTs needed for the required integrated RF circuit functions are all made on a same substrate, the electric features of which can only be the result of a compromise between the various HEMT performance requests, which may—and frequently does—give rise to criticalities concerning global MMIC performance.

Such criticalities are accentuated when the HEMTs present in MMIC amplifier circuits operating in the higher frequency spectrum from microwaves to millimeter waves must be made, in particular when a particularly broad operating spectrum is required (such as integrated multi-band amplifier circuits).

In such a case, an increase of HEMT cutoff frequencies is required, meaning the frequency associated to the unitary current gain ($f_T$) and that associated to the unitary power gain ($f_{MAX}$), which implies a decrease of the control gate length in order to decrease the parasitic capacitance thereof. Although the geometric variation of the control gate junction allows to reach such an advantage, it may be associated to the variation of other characteristic parameters of the HEMTs, which may have a negative influence on the increase of cutoff frequencies $f_T$ and $f_{MAX}$ itself. A variation is bound to the decrease of control gate metallization section area, which implies an increase of the parasitic resistance to the detriment of the increase of cutoff frequency $f_{MAX}$.

Such a problem is partially overcome by making a "T", "Γ" or "Y"-shaped geometry of the control gate metallization, which allows to make a junction (control gate foot) with short contact length, combined, towards the upper part thereof, with an extension of the metallization itself (control gate head) of larger size and raised with respect to the gate foot.

The difference between side dimensions of the control gate head and gate foot, as the height of the gate head with respect to the base of the gate foot, cannot, in all cases, exceed given limits without sensibly increasing the mechanical fragility of the metallization itself, with consequent negative consequences on manufacturing efficiency of the HEMT devices themselves, thus limiting, in fact, the decrease of control gate junction length for a fixed area of the section and parasitic capacitance associated to the extension of the gate head.

The control gate metallization section area for a fixed requirement on its parasitic resistance is then functional to the different HEMT sizes, which must be greater the more extended the width, as typically made for devices of larger size, in particular when use thereof is required for power applications, while it may be lower for smaller devices, as generally implemented in the devices used in low-noise amplifier circuits.

The decrease of the control gate junction length further generally implies a decrease of HEMT transconductance, frequently described as "short channel effect", which also has negative consequences on the increase of cutoff frequencies $f_T$ and $f_{MAX}$. Such an effect is more marked when the HEMT is biased for low drain currents and high drain voltages, conditions which are typically reached in high power applications. This aspect also implies greater criticality due to the control gate length reduction when HEMTs optimized for high power amplifier applications must be made with respect to low noise applications, in which in order to improve the RF noise features the tendency is to optimize the HEMT features so that the optimal biasing thereof is at the lowest possible drain electrode biasing voltages.

Other technical solutions, of the type described by R. Vetury, J. B. Shealy, D. S. Green, J. McKenna, J. D. Brown, K. Leverich, P. M. Garber and M. J. Poulton in the conference paper entitled "*Performance and RF Reliability of GaN-on-SiC HEMTs using Dual-Gate Architectures*", submitted to the Proceedings of the 2006 International Microelectronics Symposium and appearing in Microwave Symposium Digest, 2006, IEEE MTT-S International, 11-16 Jun. 2006, pages 714-717, are generally used to protect the HEMT from high electric fields, but may be detrimental to some performances, and must thus be optimized according to the chosen function.

This is frequently achieved, in particular in the manufacturing of GaN HEMTs, as in the example described in the literature mentioned above, with the introduction of further metallizations over the HEMT channel, between the control gate and the drain electrode, generally named Field Plates, either single or multiple, connected to a ground electric potential, which form a Schottky or Metal-Insulating Semiconductor (MIS) junction with the electrodes of the channel between the control gate and the drain electrode, the effect of which is to reduce the maximum peak intensity of the electric field in the semiconductor material, for a fixed biasing of the device with consequent benefits on the robustness of the device to high biasing voltages and on short channel effect mitigation.

Parasitic capacitances which have the effect of reducing the high frequency gain and/or bandwidth thereof are, in all cases, associated to the presence of such metallizations. Furthermore, the use of a double Schottky junction connected directly to an electric ground potential on one hand allows to drastically reduce the electric field but also has the negative effect of limiting the drain electrode current when the control gate voltage assumes positive values, thus reducing the width dynamics of the output signal, and consequently the linearity and maximum power of the amplified RF signal.

Furthermore, it is worth noting that reducing the electric field in the channel, the drain voltage being correspondingly equal, also increases the knee voltage $V_{DS}^K$, i.e. the voltage at which the features of the drain current $I_D$ as a function of the Drain-Source voltage reaches a saturation value. Such an increase of knee voltage $V_{DS}^K$ makes it necessary to use higher voltages, and thus greater dissipations, which usually do not benefit low-noise, high-frequency performance. Thus, such Field Plate solutions, particularly when introduced in high-frequency HEMTs, while being preferable for high-power applications could be counterproductive for low-noise amplification.

OBJECT AND SUMMARY OF THE INVENTION

It is thus an object of the present invention to make available a HEMT which allows to overcome the drawbacks described above, in particular which allows to optimize the performance of HEMTs for different RF functions without needing to modify the features, in terms of composition and/or doping, of the semiconductor material with which they are manufactured, and consequently the manufacturing processes of the same.

Such an object is reached by the present invention which relates to a HEMT as defined in the appended claims.

In particular, the optimization of HEMT performance for different RF functions is reached by acting on the biasing of the field plate electrode instead of on the electric features of the semiconductor material of which the HEMT is made. Essentially, each field plate electrode is electrically connected to an electric ground potential, or more in general to an electric reference potential which could also be different from the ground electric potential, by means of an electric circuit integrated with the HEMT and comprising at least one rectifying contact outside the channel region of the HEMT and distinct from the rectifying contact constituted by the Schottky junction of the field plate electrode 13', and possibly an additional electric resistance in series to the rectifying contact so as that, in the operating electric biasing conditions of the HEMT, the field plate electrode is self-biased, carrying the electric potential of the Schottky junction of the field plate electrode to positive values close to the driving voltage of the Schottky junction itself. This can be achieved, for example, by putting the field plate electrode into contact with the anode of a diode, which, in turn, has the cathode connected to ground by means of a resistive element.

By virtue of a connection of this type, the field plate electrode is self-biased at a knee voltage of a diode (typically +1 V, if the diode is made with a Schottky contact with the electrons in GaN), preventing in this manner the HEMT channel from remaining choked by the field plate electrode when the RF signal applied to the control gate reaches positive voltage values. Furthermore, the presence of a resistive network between the field plate electrode and the ground allows to limit RF output signal loss because the parasitic capacitance of the field plate electrode is connected to ground not directly through a short circuit but through a RC series filter.

DETAILED DESCRIPTION OF PREFERRED EMBODIMENTS OF THE INVENTION

The present invention will now be described in detail with reference to the appended figures in order to allow a person skilled in the art to make it and use it. Various changes to the described embodiments will be immediately apparent to people skilled in the art, and the described generic principles may be applied to other embodiments and applications without because of this departing from the scope of protection of the present invention, as defined in the appended claims. Therefore, the present invention must not be considered limited to the described and illustrated embodiments but instead confers the broadest scope of protection, in accordance with the principles and features described and claimed herein.

Figure 1:
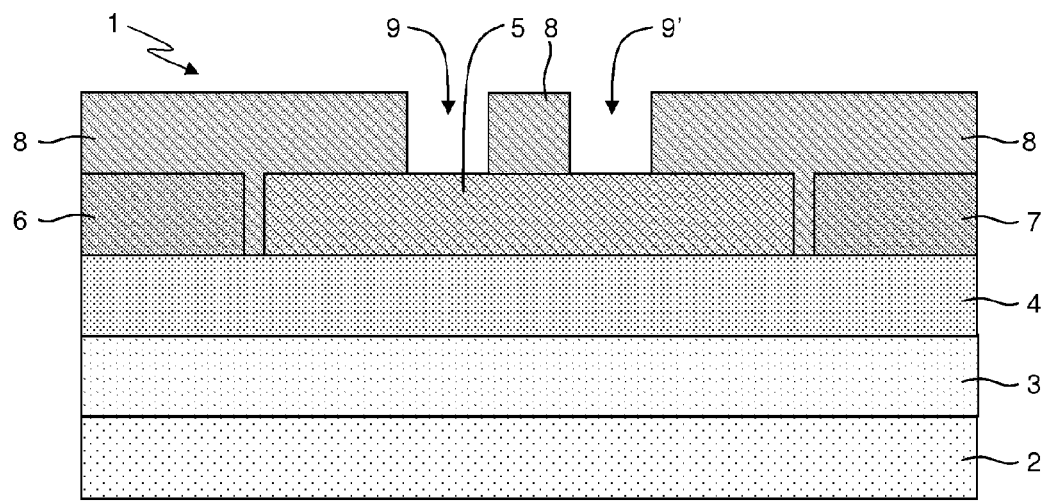
FIGS. 1-3 are schematic section views of a HEMT with Schottky control gate and field plate electrodes according to an embodiment of the invention.
Figure 2:
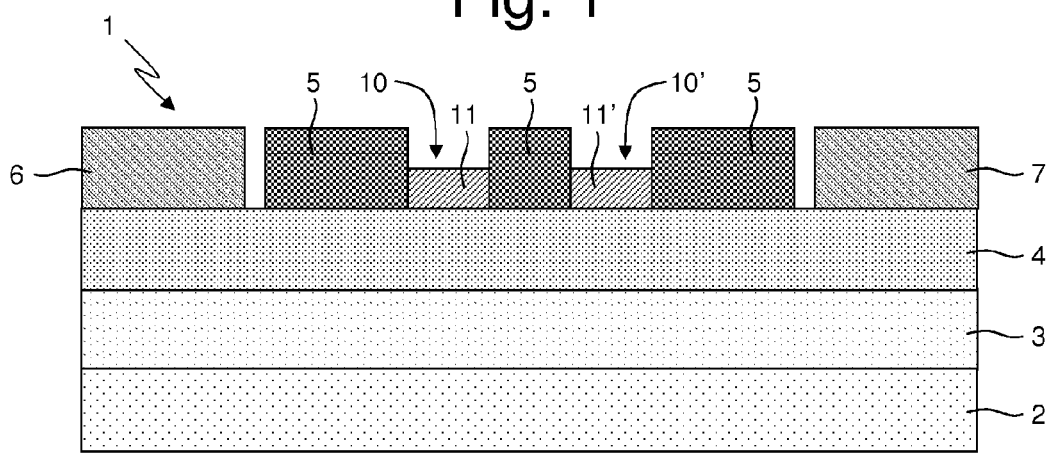
Figure 3:
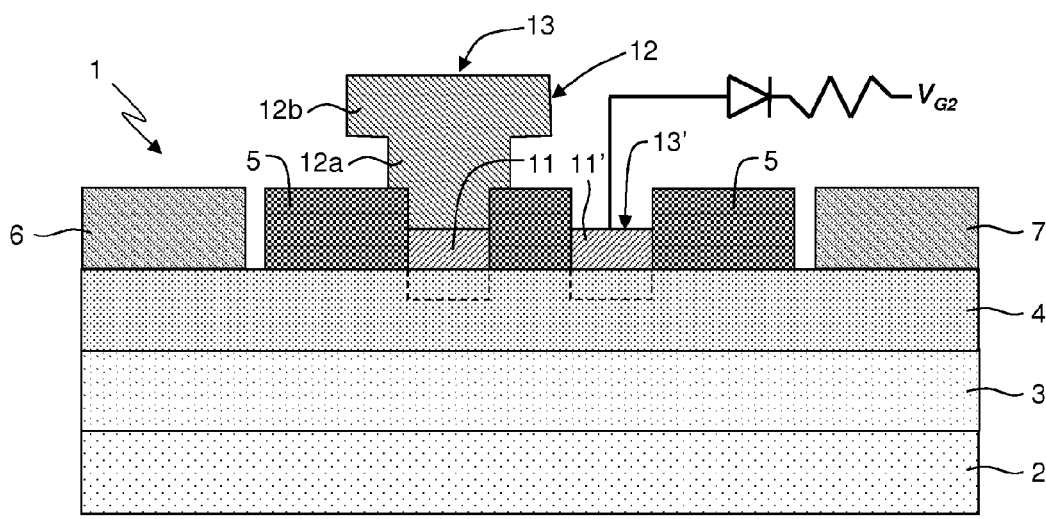

FIGS. 1-3 schematically illustrate in section view a HEMT according to a preferred embodiment of the present invention during different steps of the manufacturing process thereof.

In particular, in FIG. 3 numeral 1 indicates as a whole a HEMT comprising:
an epitaxial substrate comprising:
a semi-insulating substrate 2, generally made of semiconductor material, e.g. Silicon (Si), Silicon Carbide (SiC), Gallium Nitride (GaN) or Sapphire ($Al_2O_3$);
a buffer layer 3, preferably comprising a Nitride of a Group III element, such as Gallium Nitride or Aluminum Gallium and/or Indium (GaN/AlGaN/InGaN/AlInGaN), conveniently Gallium Nitride (GaN), formed on the semi-insulating substrate 2, possibly by interposition of other layers; and
a barrier layer 4, preferably also comprising a Nitride of a Group III element, in particular Gallium Nitride, Indium and Aluminum (InAlGaN), formed on the buffer layer 3, possibly in turn formed by layers with variation of composition and doping; and
a mechanical and/or passivation layer 5, preferably made of dielectric material, such as Silicon Nitride (SiN), Silicon Dioxide ($SiO_2$) or formed by several superimposed layers formed thereby, formed on the barrier layer 4 and in which exposed portions of the barrier layer 4 are left defining a first and a second ohmic contact region;
a source electrode 6 and a drain electrode 7 formed respectively on, and in ohmic contact with, the exposed portions of the barrier layer 4, in the first and second ohmic contact region, respectively;
a control gate 13 formed on, and in Schottky contact with the barrier layer 4, between the source 6 and the drain electrode 7, from which it is laterally separated; and
a control gate 13 formed on, and in Schottky contact with the barrier layer 4, between the control gate 13 and the drain electrode 7, from which it is laterally separated.

The control gate 13 is used to modulate the input signal and is made in proximity of the source electrode 6, while the field plate electrode 13' performs the field plate function for mitigating the electric field within the HEMT 1, thus increasing the reliability and robustness thereof, and reducing the short channel effects to the advantage of RF gain of the HEMT 1, and is generally also made between the source 6 and drain 7 electrodes, but localized in position closer to the drain electrode 7 with respect to the control gate 13 and separated therefrom.

One or more further passivation layer(s), preferably made of SiN and/or $SiO_2$, can be then deposited on the mechanical protection and/or passivation layer 5 and on the ohmic contacts 6 and 7.

The source 6 and drain 7 electrodes are conveniently formed by forming a mask over the mechanical protection and/or passivation layer 5 conveniently formed by a photolithographic resist layer which is patterned so as to form a first and second window at the first and second ohmic contact region. The mechanical protection and/or passivation layer 5 is then chemically etched at the first and the second window to the interface with the barrier layer 4 and a metal deposition is thus performed at the exposed positions of the barrier layer 4, which leads to the formation of the source 6 and drain 7 electrodes. The HEMT 1 is thus subjected to a thermal cycle which binds the source 6 and drain electrodes 7 to the barrier layer 4 underneath, so as to form a non-rectifying (ohmic) contact between metal and electrons present in the channel.

In an alternative embodiment, the source 6 and drain electrodes 7 may be formed on the barrier layer 4 before the mechanical protection and/or passivation layer 5, and the latter may then be deposited between the source 6 and drain 7 electrodes.

The source 6 and drain 7 electrodes may be conveniently formed so as to be smaller than the respective windows of the mechanical and/or passivation protection layer 5, so as to be distanced therefrom. Preferably, this difference between the size of the windows in the mechanical and/or passivation layer 5 and the windows of the source 6 and drain 7 electrodes is obtained by using an isotropic chemical etching, or partially such, for removing the mechanical protection and/or passivation layer 5, after having applied the mask for defining the source 6 and drain 7 electrodes and before metal deposition. Preferably, when the mechanical protection and/or passivation layer 5 is made by means of layers of Silicon Nitride (SiN) and/or Silicon Dioxide ($SiO_2$), the isotropic chemical etching may be obtained by immersion in a liquid solution based on the mixture of $NH_4F$, HF and $H_2O$.

In order to define the electrically conductive semiconductor areas of the MMIC surface on which active devices are made, with respect to the electrically non-conductive semiconductor areas, on which the passive components are generally made, the barrier layer 4 is made electrically insulated from the outside of the active area of the HEMT 1. This can be achieved after having firstly protected the surface which is desired to be left electrically conductive with a mask conveniently formed by an appropriately patterned photolithographic resist layer, and then by making electrically non-conductive the area not covered by such a mask by means of a bombarding process of the surface, e.g. by implanting fluoride ions at energy comprised between 50 KeV and 300 KeV and dose comprised between $5 \times 10^{13}$ $cm^{-2}$ and $2 \times 10^{14}$ $cm^{-2}$, or alternatively by removing the conductive parts of the semiconductor material present outside the mask, by operating a chemical-physical etching of the material not protected thereby to completely eliminate the barrier layer 4 outside and expose the buffer layer 3 underneath. For both procedures, the insulation process is performed before defining the control gate 13 and the field plate 13', as described below.

The control gate 13 and the field plate 13' are made at the same time in the manner described below with reference to FIGS. 1 and 2. As illustrated, on the mechanical and/or passivation layer 5 and on the first and second ohmic contact 6, 7 (and on any further passivation layers on these deposits) is formed a masking layer 8 (FIG. 1) provided with two through openings 9 and 9' which expose respective portions of the mechanical and/or passivation protection layer 5 between the ohmic contacts 6 and 7. Preferably, the masking layer 8 is a photolithographic resist layer, which is photolithographically patterned to form the openings 9 and 9', which can conveniently have minimum size in the order of several tens of nm.

Two through windows 10 and 10' are thus formed in the mechanical and/or passivation protection layer 5, at the openings 9 and 9' in the masking layer 8, so as to expose respective surfaces of the barrier layer 4 defining a Schottky contact region in which the control gate 13 and the field plate electrode 13' will then be made. In particular, the windows 10 and 10' are made by means of selective low damage chemical etching which erodes the mechanical protection and/or passivation layer 5 to the interface with the barrier layer 4.

Lower portions 11 and 11' of the control gate 13, and respectively of the field plate 13', hereinafter named gate feet, is thus formed at the same time on the exposed portions of the barrier layer 4, in the windows 10 and 10', by means of selective deposition by evaporation by means of a lift-off process, of a metallization comprising one or more metal element(s) with high working function, in particular equal to or higher than 5.0 eV, and preferably Nickel (Ni) and/or Platinum (Pt), conveniently both (see with this regard the aforementioned article "*Thermal annealing effects on Ni/Au based Schottky contacts on n-GaN and AlGaN/GaN with insertion of high work function metal*"), i.e. a deposition of multiple layers composed of metals with such features.

The deposition process of such metals may occur by means of low mechanical damage procedures, such as vacuum evaporation depositions, which cannot be performed, or which are difficult to perform, with refractory metals due to their intrinsic high fusion temperature. The interface of the semiconductor material towards the surface is, at the end of the definition of the gate foot 11 by metallization lift-off, only in the window 10 protected by compatible metals or by passivation layers in order to be able to apply the annealing process after gate foot deposition 11.

In particular, the gate feet 11 and 11' are formed so as to extend through the mechanical protection and/or passivation layer 5 by a height not higher than, and conveniently lower than the total thickness of the mechanical protection and/or passivation layer 5 and possible further passivation layers, so as not to protrude from the windows 10 and 10'. This allows to facilitate the physical separation between the metal deposited on the barrier layer 4 and that deposited on the masking layer 8, and thus the subsequent removal of the latter metal by using the exposure to solvents (such as, for example, acetone or N-Methyl-2-pyrrolidone/NMP) of the masking layer, if it is composed by photolithographic resist, as in the embodiment described above.

Optionally, before metallization deposition on the feet 11 and 11' of the control gate 13 and of the field plate electrode 13' a chemical etching of the barrier layer 4 may be made at the windows 10 and 10' so as to make recesses in the barrier layer 4, illustrated in FIG. 3 with a dashed line, so that the metallization of the feet 11 and 11' of the control gate 13 and of the field plate electrode 13' penetrate partially into the barrier layer 4. In a variant (not shown) using different masks it would be possible to make only one of the two recesses, conveniently only the one at the gate foot 11 of the control gate 13, the latter being the configuration which allows to limit the choking effect caused by the presence of the field plate electrode 13'.

The HEMT 1 is thus subjected to a thermal stabilization and annealing treatment in order to remove the damage to the crystal lattice of the surface of the semiconductor from the previous steps of the process, such chemical etching, performed on the mechanical protection and/or passivation layer 5 and possibly on the barrier layer 4, deposition of metallic and/or dielectric layers and other, and stabilizing the metal-semiconductor interface of the Schottky junction. For effective removal of a Group III Nitride it is generally convenient to use thermal cycles after the metallization deposition which forms the Schottky barrier with the semiconductor, in which the temperatures reached exceed 450° C., and thus may be higher than the diffusion temperatures of Gold (Au) and/or Aluminum (Al) in the previously mentioned metals and which form the Schottky barrier during definition of the gate feet 11 and 11'.

With reference again to FIG. 3, a higher portion 12 of the control gate 13 only, hereinafter indicated as gate head, is thus formed on the gate foot 11, e.g. by deposition of a metallization comprising one or more metal element(s), at least one of which with low reactivity, such as Gold (Au) or Aluminum (Al) with high thickness, possibly by means of the interposition, between the gate head 12 and the gate foot 11, of other barrier metal layers such as Nickel (Ni) or Titanium (Ti), in order to limit the possibility of a chemical reaction with the metallization gate foot 11.

In particular, the gate head 12 is formed so as to protrude from the window 10 and preferably display a first portion 12a which extends laterally onto the surface of the mechanical protection and/or passivation layer 5, outside the window 10, so as to rest on and be mechanically supported by the latter, thus improving mechanical adherence of the control gate 13 to the portions with which it is in contact, but without significantly increasing the global parasitic capacitance of the control gate 13. In other words, the gate head 12 is patterned so as to define in section, jointly with the gate foot 11, a stair-step profile at the first portion 12a.

The gate head 12 is further formed in a manner so as to present a second portion 12b vertically distanced from and extending laterally to one or both sides of the first portion 12a, so as to provide an optimized profile section to the gate head 12, e.g. the geometry of which assumes an aspect comparable to that of letters "T", "Y" or "Γ", to minimize parasitic capacitance and resistance of the control gate 13, allowing to use metals which are not necessarily compatible with the high temperature thermal cycles used in the first step of forming the gate foot 11.

In the preferred embodiment, in order to obtain the "T" "Y" or "Γ" geometry of the gate head 12, a process using electron beam lithography is used which, by impressing multiple resist layers, deposits the areas in which the mask must be formed by such resists with different thicknesses and sensitivity on the surface of the wafer, allowing to obtain openings, after the subsequent step of developing, the profile of which is optimized to provide the required geometry to the gate head metallization, in addition to facilitating the physical separation between deposited metal at that of the gate foot and that deposited over the multilayer resist mask.

According to an aspect of the present invention, the field plate electrode 13' is electrically connected to a ground electric potential, or more in general to a reference electric potential which could also be different from the electric ground potential, through connection external to the channel region of the HEMT 1.

The reason for this solution is in that the field plate electrode 13' has the function of modifying the electric field in the channel by virtue of the modulation of the electrodes in the channel provided by the field plate junction, e.g. by extending the potential drop zone on the side of the control gate towards the drain electrode, thus decreasing the electric field peak value, the applied drain biasing being equal, and thus improving and mitigating the short channel effect of the HEMT 1 with respect to a similar device from which the field plate electrode 13' is absent instead.

Because the field plate electrode 13' never needs to carry a RF signal and a static electric field is applied instead, reducing its resistance by superimposing a gate head metallization as in the control gate 13 is not necessary, and thus the making of the field plate electrode 13' with metallization of the gate foot 11' only facilitates its collocation in proximity of the control gate 13, so as to modulate the voltage drop in the channel of the HEMT 1' in the semiconductor volume near the control gate 13 from the side towards the drain electrode 7, thus allowing to control the electric field in such a zone, where the peak value is typically found, by decreasing the peak value thereof, and consequently mitigating the associated risks for reliability of the HEMT 1', such as reverse piezoelectricity or charge generation for impact ionization.

The field plate electrode 13', particularly when made with a Schottky junction, also has the further protective function of limiting both the current which flows through the control gate 13, by shielding and collecting the charge in excess generated by the impact ionization phenomena, and limiting the maximum drain current if the control gate 13 exceeds the driving voltage of a Schottky diode. Indeed, the field plate 13' electrode, when it is made with a Schottky junction connected to a fixed voltage, typically ground voltage through an electric circuit with short-circuits the field plate electrode 13' to the source electrode 6, may limit the current in the channel because such a biased junction has the effect of emptying the electrons present under such a junction, thus limiting the current which flows in the channel according to its electric potential.

However, in order to avoid this electric potential from having an excessive limiting effect on the maximum drain current, thus compressing the RF signal width dynamics at the terminals of the drain electrode, the field plate electrode 13' must be biased at voltages higher than those reached by the control electrode 13, and this can be conveniently made through an appropriate electric circuit integrated with the HEMT 1' and comprising a rectifying contact, outside the channel region of the HEMT 1' and distant from the rectifying contact constituted by the Schottky junction formed by the field plate electrode 13', and an additional electric resistor in series to the rectifying contact, so that, in the operative electric biasing conditions of the HEMT 1', the field plate electrode 13' is self-biased taking the electric potential of the Schottky junction of the field plate electrode 13' to positive values close to the driving voltage of the Schottky junction.

This can be made for example by putting the second field plate electrode 13' into contact with the anode of a diode, which, in turn, has the cathode connected to ground through a resistive element, as schematically shown in FIG. 3.

By virtue of a connection of this type, the field plate electrode 13' is self-biased at the direct biasing potential typically of +1 V, if the diode is made with a Schottky contact with the electrons in GaN, preventing in this manner the channel of the HEMT 1' from remaining choked by the field plate electrode 13' when the RF signal applied to the control gate 13 reaches positive voltage values. Furthermore, the presence of a resistive network between the field plate electrode 13' and ground allows to limit RF signal output loss because the parasitic capacitance of the field plate electrode 13' is connected to ground not directly through a short circuit but through a RC series filter instead.

Figure 4:
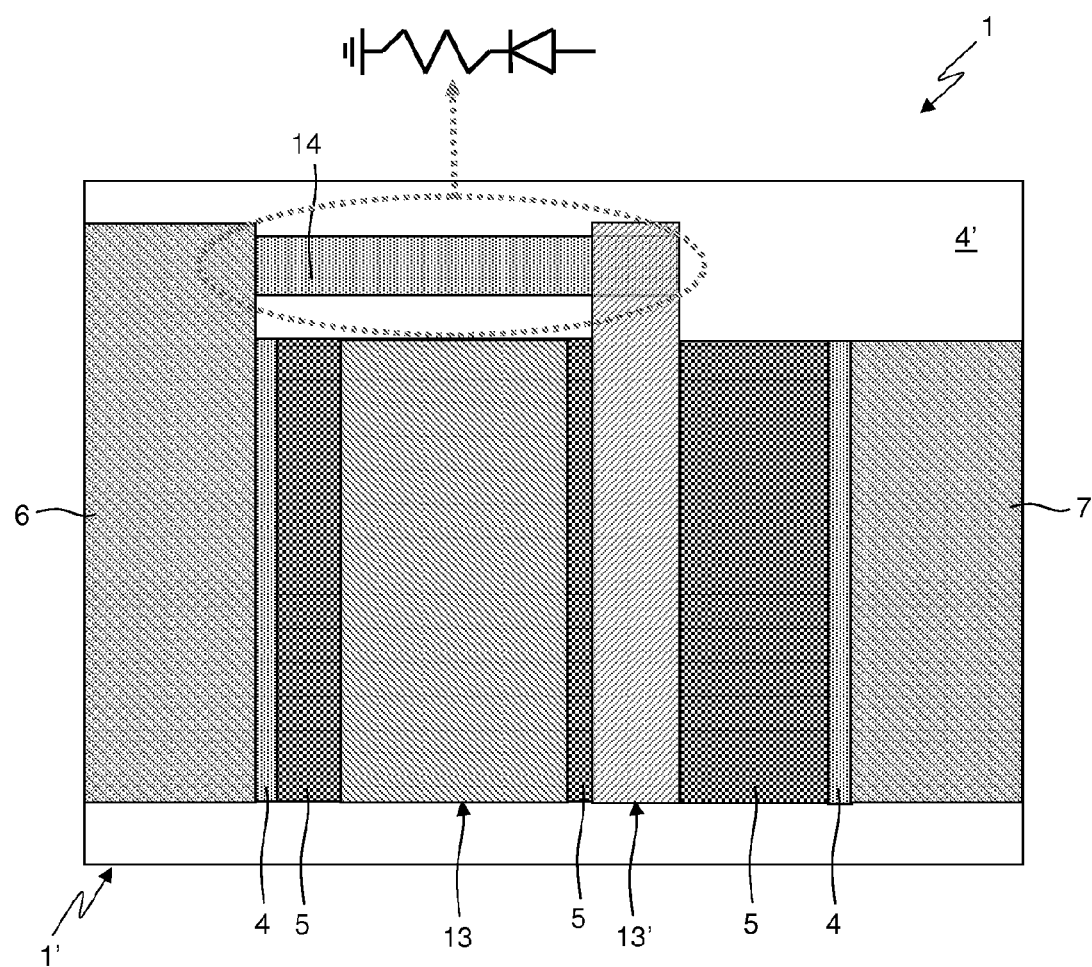
FIG. 4 is a plan view of the HEMT in FIG. 3.

The connection to a ground potential of a field plate electrode 13' with the features described above may be conveniently made so as to be integrated in the same MMIC, i.e. without connecting the field plate 13' electrode to elements and/or further external biasing circuits of the MMIC itself, as schematically illustrated in FIG. 4. In particular, during the step of electric insulation of the area, indicated in FIG. 4 with 4', in the barrier layer 4, external to the active area of the HEMT 1 and in which the electric connection circuit of the field plate 13' electrode to the electric ground potential will be obtained, by means of an appropriate patterning of the protection mask, a resistive strip of semiconductor material 14 may be formed having a first end connected to the field plate 13' electrode, which thus forms a Schottky junction with the latter, the metallization of the field plate 13' of which represents the anode, and a second end electrically connected to a reference potential $V_{G2}$ through an ohmic contact.

In the example shown in FIG. 4, the connection of the resistive strip 14 to an electric ground potential is preferably made by superimposing a second end of the resistive strip 14 to the source electrode 6, which is generally connected to ground. The superimposition of an end of the resistive strip 14 and the field plate electrode 13' makes the rectifying contact with the required features described above, the capacitance of which can be controlled according to the area of the superimposition between resistive strip 14 and the field plate electrode 13'. Furthermore, such a superimposition allows to make, in combination with the geometry of the resistive strip 14, which regulates its resistance R, the combination of the series resistance and capacitance values (RC) to obtain the required RF insulation of the field plate electrode 13'.

The same advantages of the embodiment previously described and illustrated in FIG. 4 could be obtained by omitting the rectifying contact and connecting the field plate 13' electrode to an equivalent electric positive potential $V_{G2}$, and more in general not negative, by means of an appropriate power supply line present in the integrated circuit. Such a solution, while introducing a greater circuit complexity due to the presence of additional power supply lines, allows to choose the value of the potential to be applied to the field plate 13' electrode, e.g. by applying voltages higher than +1V, so as to optimize performance for the required MMIC functions.

In order to apply voltages higher than +1V to the field plate 13' electrode by means of its self-biasing, consequently to the advantage of circuit simplicity, it is possible to make, according to a variant of the process compatible with the same technological steps illustrated above and with appropriate layout variations to the deposited metallization, the electric connection of the field plate 13' electrode to the reference potential $V_{G2}$ by means of an electric circuitry comprising several rectifying contacts, conveniently two, connected in series by means of an equal number of resistive strips 14, external to the HEMT 1 channel and distinct from the rectifying contact constituted by the Schottky junction defined by the metallization of the field plate electrode 13' with the barrier layer 4.

Figure 5:
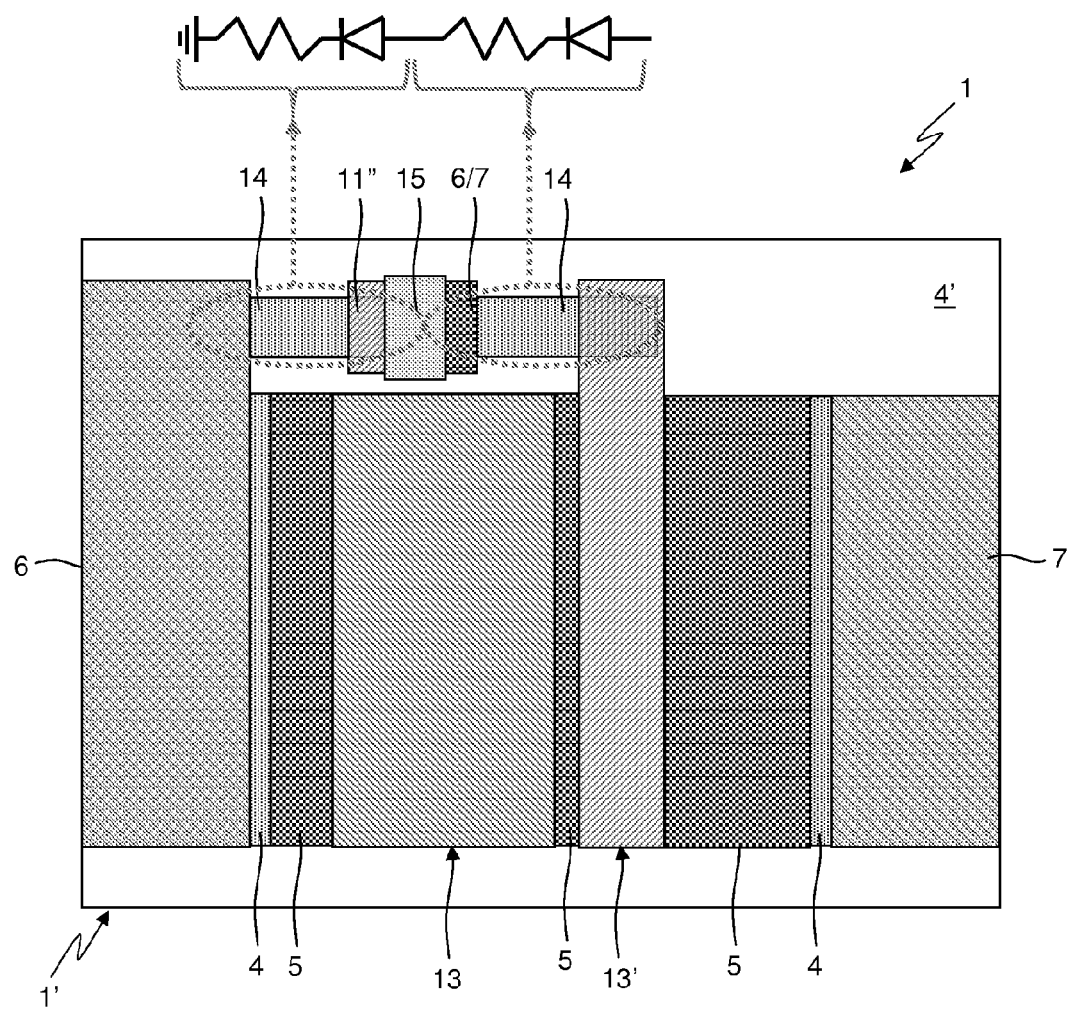
FIG. 5 is a plan view of a variant of the HEMT in FIG. 4.

This can be made in manner similar to that previously described for the integrated manufacturing of the single diode connected in series to a resistive strip, in the manner illustrated in FIG. 5, related to the ground connection of the field plate 13' electrode by means of a pair of diodes and resistors, i.e. making resistive strips 14 of semiconductor material in the electrically non-conductive area 4' of the HEMT 1, forming on the terminals of such resistive strips 14 either an ohmic contact, made at the same time as the formation of the source or drain electrodes 6, 7, or a metallization of the Schottky junction deposited along with that of the control gate 13 and/or of the field plate electrode, indicated in FIG. 5 by numeral 1'', connecting such resistive strips 14 made in this manner with metallizations, such as that indicated with numeral 15 in FIG. 5, which, by short-circuiting the terminals thereof so as to form a chain of Schottky diodes and resistors, which at the ends are in contact with the field plate junction and one of the metallizations, appropriately chosen from those present on the MMIC circuit. In such a manner, the biasing of the field plate electrode is made by the self-biasing of the rectifying junction, made by the Schottky diode chain and resistors, with respect to one of the potentials used to power the MMIC.

The two-step formation of the control gate 13, with thermal treatment after the formation of the gate foot 11, allows instead to overcome the physical limits imposed by the tempering temperature in presence of low resistivity metallization (Au or Al) of the gate head 12: the latter, indeed, if subjected to temperatures close to fusion temperature (660° C. for Al and 1064° C. for Au), or alloying temperature with gate foot metallization 11, may be deformed not maintaining the original geometry obtained after deposition, may reduce the overall resistivity of the metallization of the control gate 13, being the alloys of such metals more resistive, and may diffuse in the barrier layer 4, thus worsening the rectifying features of the Schottky contact. Such limitations may be instead overcome by using the thermal annealing treatment after the metallization deposition of the gate foot 11 in absence of that of the gate head 12, thus allowing to use metals which are not necessarily compatible with the high temperature thermal cycles used in the step of forming the gate foot 11.

Another advantage of the two-step formation of the control gate 13 consists in the possibility of using, in the lithographic steps, a thinner photolithographic resist layer for the deposition of the gate foot 11, which makes the making of junctions of a few tens of nanometers less critical, than that for gate head deposition 12, in which the need for thicker metal deposition (hundreds of nm) for abating the parasitic resistance of the control gate 13 make it necessary to use a thicker resist.

Furthermore, the two-step constructive process of the control gate 13 allows to vary the properties of the latter so that the electric features of the HEMTs in the MMIC have optimized features for each RF function, e.g. by adapting different sizes of the gate foot 11 according to the required application, starting from the semiconductor material itself, with respect to those available by a single type of transistor which performs the various RF functions.

This leads to a modular technology adapted to various applications without needing to change the features of the semiconductor material of which the HEMT 1 is made, thus avoiding to consequently modify the manufacturing processes required for developing new functions.

It is further accessible to make transistors optimized for multiple RF functions on a single MMIC, with economic advantages, above all during the step of assembly with respect to the current making of modules in which multiple MMICs, each optimized for each RF function, are present.

Furthermore, a multifunctional MMIC based on the constructive process object of the invention allows to optimize the features of each HEMT used in the MMIC, thus improving its global features with respect to an MMIC in which the electric features of the HEMT were in common to all the RF functions.

The metallization deposition of the gate foot 11 of the control gate 13 only inside the opening 10 by selective deposition by means of a lift-off process allows to avoid the removal process of the refractory metal used for the Schottky junction present on the entire surface of the wafer outside the control gate 13, without even the need for excessive chemical etching for removing the outer insulating surface of the definition mask of the gate head 12 of the control gate 13, which removal, being obtained by bombarding the surface of the semiconductor, may worsen the features of the underneath semiconductor material in the outer region of the device of the control gate 13, especially in the case of a planar process, i.e. without recesses, such as that generally used for manufacturing GaN HEMTs.

The selective deposition by means of a lift-off process of the metallization of the gate foot 11 of the control gate 13 allows to make the metallization of the integrated Schottky field plate present in the opening 10' consisting only of the metallization of the gate foot 11' (thus not superimposed on the low resistivity metallization 12) and made in proximity of the opening 10 for the control gate 13'.

Such a result could not be obtained with a process of the type described in EP 0 592 064, because the refractory Schottky metal etching process would not comprise that present under the gate head mask, while it would removed it everywhere outside: indeed, if the opening 10' were outside the covered portion of the gate head 12', the metallization of the gate foot 11' would be removed by the chemical etching process, while if it were inside, instead, as desired so that the Field Plate can better control the electric fields in proximity of the control gate, the chemical etching would not remove the metal present from between the openings 10 and 10', because it is covered by the gate head metallization, which thus forms a mask for the etching of the metal underneath, and this creates an electric continuity between the feet 11 and 11', fact undesired to be able to bias the gate foot 11' at the optimal potential.

It is worth noting that the superimposing of a low resistivity metallization at the metal of the gate foot 11' is to the advantage of the high frequency gain of the device because the higher resistance of the Field Plate contributes to decreasing the RF loss connected to its presence.

Figure 6:
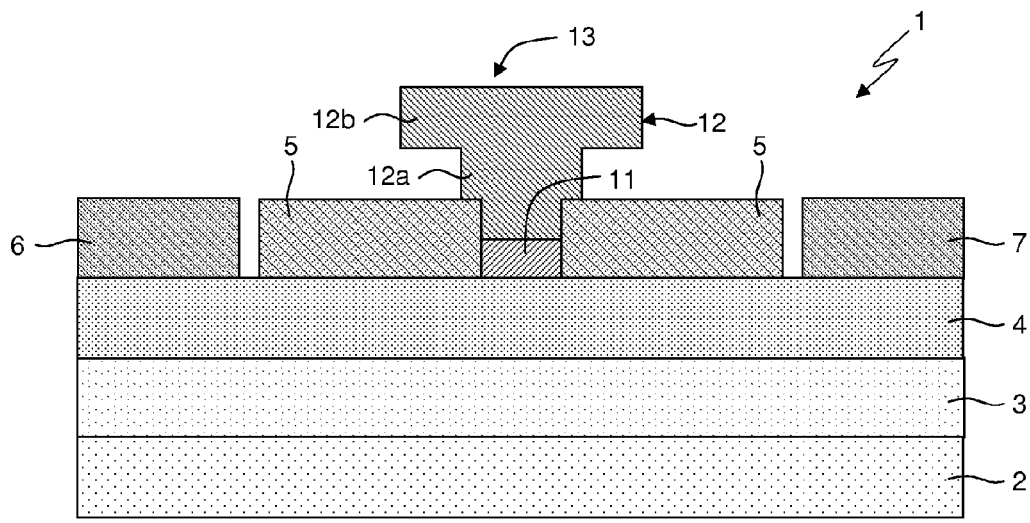
FIG. 6 is a schematic section view of a HEMT with Schottky control gate made in two steps.

The two-step constructive approach described above further allows to make both single control gate HEMTs i.e. without field plate electrode, with Schottky junction, which are more appropriate to the low noise amplification function and HEMTs in which the control gate 13 is combined to a field plate electrode 13', which have advantages in the power amplification function with a single constructive process, with potentials of making integrated semiconductor devices with optimized features for different functions, especially those intended for high frequency applications, on the same monolithic circuit. A single control gate HEMT with Schottky junction is shown by way of example in FIG. 6, in which the reference numbers corresponding to those used for the HEMT 1 illustrated in FIGS. 1-3 identify corresponding parts.

Figure 7:
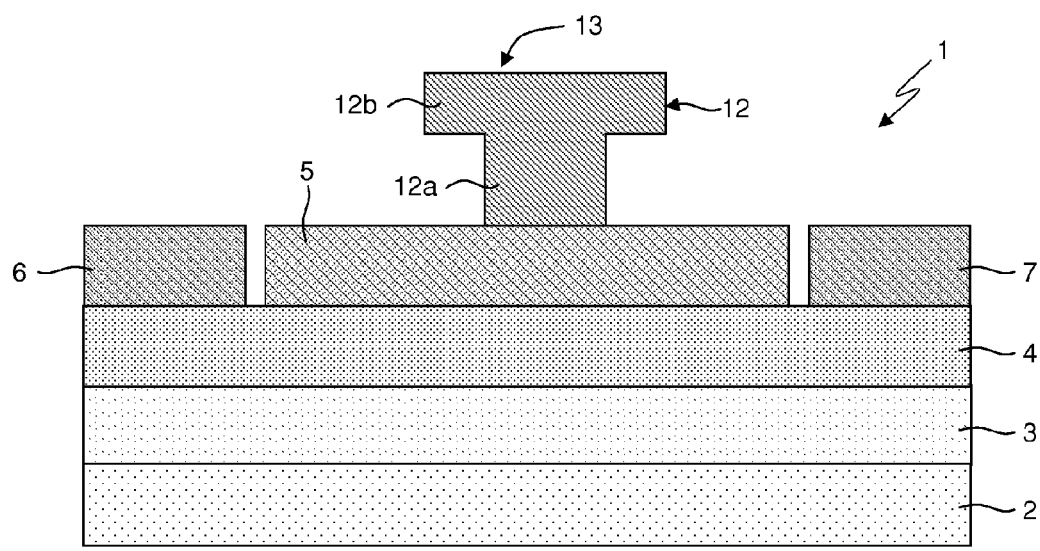
FIG. 7 is a schematic section view of a HEMT with Metal-Insulating Semiconductor control gate electrode.

Another potential advantage of the two-step constructive approach of the control gate 13 consists in the possibility of using the metallization deposition of the gate head 12 also without having previously performed the metallization of the gate foot 11, thus making HEMTs with Metal-Insulating Semiconductor electrodes (MIS), as shown by way of example in FIG. 7, or the metallization of the gate foot 11 only, also without needing to deposit the metallization of the gate head 12, thus making HEMTs with Schottky control gates of particularly small physical size, of the type shown in FIG. 2. In such a manner, it is possible to optimize the performance of the HEMT according to the integrated circuit to be made without because of this introducing further technological manufacturing steps, for the advantage of constructive simplification and consequent economic and manufacturing efficiency benefits.

Such possibilities are suited to be used in integrated electronic devices also comprising HEMTs optimized for switching operations, in combination to single control gate HEMTs and/or HEMTs with control gate and field plate electrode with signal amplification function of the described and illustrated type. Indeed, HEMTs with MIS control gate allow to obtain a lower insertion loss and a greater robustness in on state by virtue of the higher signal charge associated to an insulation and a robustness to high voltages when operating in the off state not lower than those obtained with a device with a Schottky junction.

In the case of HEMTs with Schottky control gate defined by the gate foot 11 only, there is the possibility of inserting several control gates over the channel region of the HEMT at a distance of a few microns from the source and drain electrodes, thus making a structure similar to that shown in FIG. 2, by virtue of which it is possible to multiple by a factor close to the number of control gates over the HEMT channel region both the maximum voltage applicable to the HEMT input and the HEMT RF insulation in off state, and at the same time to contain the parasitic resistance of the channel in on state by virtue of the reduced distance between the source and drawing contacts.

Figure 8:
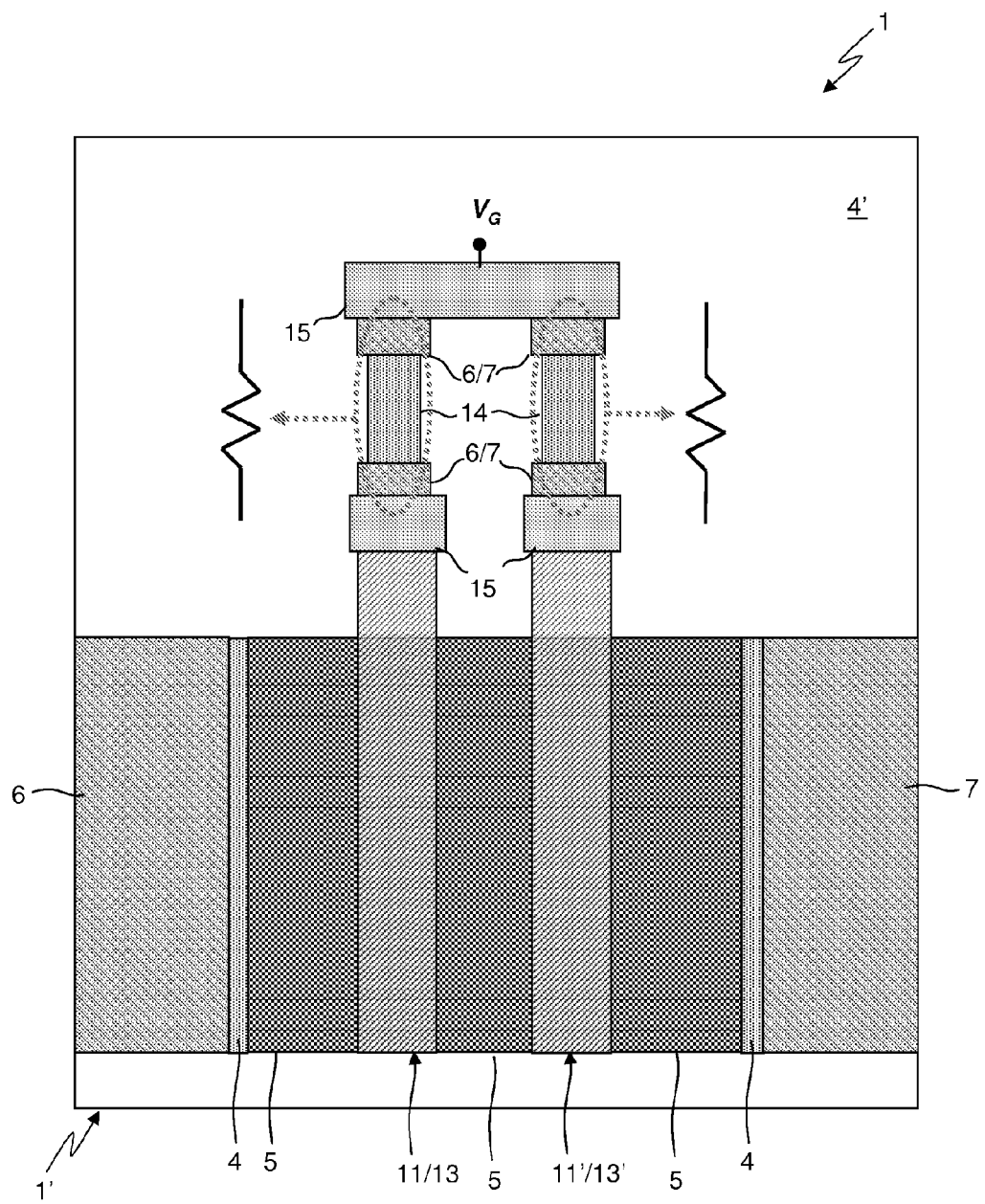
FIG. 8 is a plan view of a further variant of the HEMT in FIG. 4.

The manufacturing of HEMTs for RF signal switching applications is advantageous in connecting the electrode or control gates 13 over the HEMT channel by means of resistive elements as those schematically indicated by numeral 14 in FIG. 8, which shows a switch device with double control electrode, and which, as known in the prior art, have the function of decreasing the RF signal loss towards the outside of the HEMT. In a preferred embodiment, such resistive elements 14 may be conveniently made in integrated form within the MMIC defining the electrically conductive semiconductor areas outside the channel of the HEMT 1, during the step of electric insulation, as previously described for making the resistive element for the ground connection of the field plate electrode 13'. The making of the control gate 13 with metallization of the gate foot 11 only has the further advantage of better resistivity of such a metallization, thus further contributing to decreasing the RF signal losses towards the outside of the HEMT.

It is finally apparent that changes and variations can be made to the described and illustrated HEMT without therefore departing from the scope of protection of the present invention, as defined in the appended claims.

Figure 9:
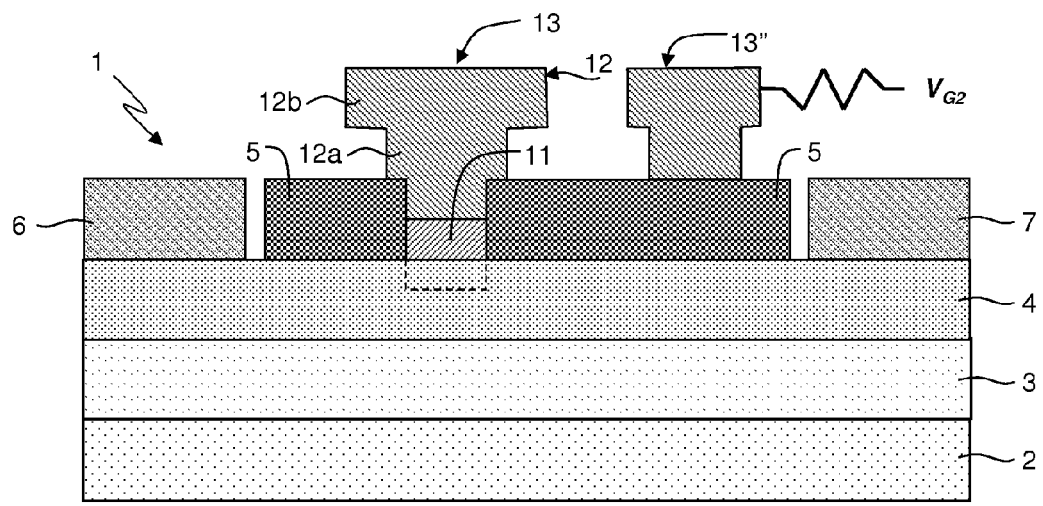
FIG. 9 is a schematic section view of a HEMT with Schottky control gate electrode and Metal-Insulating Semiconductor field plate electrode.

It is, for example, possible by means of the same manufacturing steps illustrated above and by means of appropriate changes to the lithographic masks defining the metallic deposition areas, thus allowing the integration on the same MMIC of the previously illustrated device types to make HEMT devices having field plate electrode which forms a MIS type junction with the channel, by depositing only the head metallization, as schematically illustrated in FIG. 9 and indicated with 13". Such a figure is also illustrates the solution of connecting the field plate 13" electrode metallization to a reference potential $V_{G2}$ through the connection with a series resistor, in order to decrease the RF loss caused by its presence, by making a resistive insulated semiconductor strip, similarly to the manner shown above for different types, in the electrically non conductive area 4' of the barrier layer 4, external to the electrically conductive area in which the HEMT 1 is made.

Figure 10:
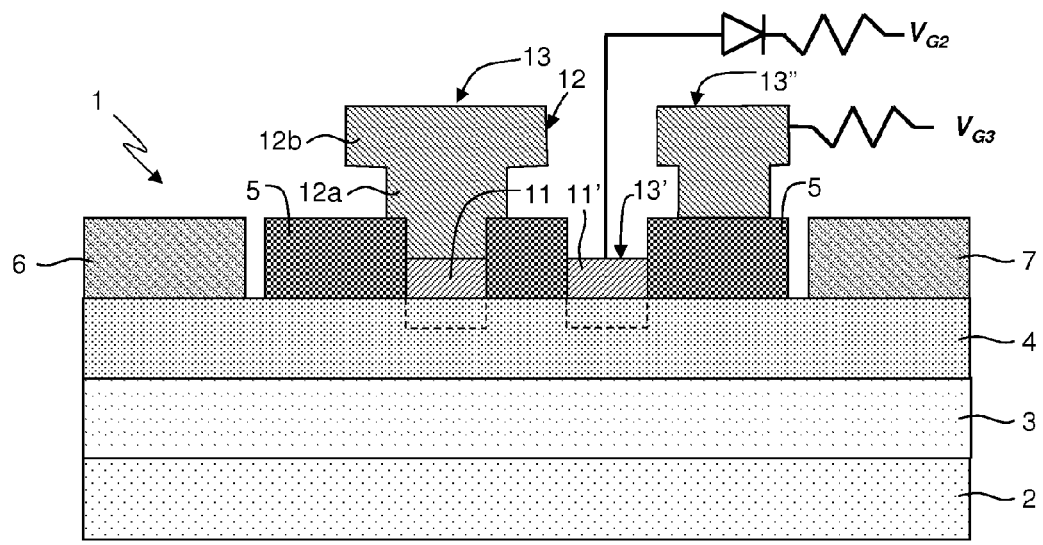
FIG. 10 is a schematic section view of a HEMT with Schottky control gate electrode and two field plate electrodes, one Schottky and the other Metal-Insulating Semiconductor.

It is also possible, in order to obtain a better control of the modulation of the electric field present in the channel device with respect to HEMT devices with or without a single field plate electrode for obtaining a further optimization of performance of the HEMTs for the required circuit functions, it is possible to insert multiple field plate electrodes between the source and drain 6, 7 electrodes, by the side of the control gate 13 and over the barrier layer 4, making therewith Schottky or MIS junctions, choosing the best biasing for the desired performance for each one, as schematically illustrated in FIG. 10, which represents the case of a single control gate 13 and a double field plate electrode, one indicated as 13', which forms a Schottky junction with channel and the other indicated as 13", which forms a MIS junction with the same. Similarly as described above, it is possible to obtain this without inserting in the circuit as many power supply lines to be connected to the field plate electrodes as many are the required biasing but instead by connecting the field plate electrodes to the power supply potentials or to the electrodes of the devices through the electric connection comprising one or more rectifying contact(s) and/or resistor(s) in series, thus simplifying the power supply and the circuitry of the MMIC comprising the aforesaid HEMT devices.

The invention claimed is:

1. A high electron mobility transistor comprising:
    an epitaxial substrate comprising a semi-insulating substrate, a buffer layer, and a barrier layer sequentially stacked;
    a mechanical protection and/or passivation layer formed on the barrier layer, and
    first and second current conductive electrodes formed on the barrier layer; and
    a control gate and a field plate electrode formed on the barrier layer, between the first and second current conductive electrodes;
    characterized by:
    an electric circuit formed to electrically connect the field plate electrode to an electric reference potential, and comprising at least one rectifying contact formed outside a channel area of the high electron mobility transistor and distinct from a rectifying contact defined by a Schottky junction that includes the field plate electrode.

2. The high electron mobility transistor according to claim 1, wherein:
    the barrier layer comprises an electrically conducting area in which the high electron mobility transistor is formed, and an electrically non-conducting area formed outside the electrically conducting area;
    and wherein the electric circuit comprises:
    an electrically conductive strip of semiconductor material formed in the electrically non-conducting area of the barrier layer and having an electric resistance depending on geometric dimensions and resistivity of the semiconductor material; the electrically conductive strip having a first end electrically connected, via an ohmic contact, to the reference electric potential and/or to another electrically conductive strip, and a second end connected to at least one Schottky junction, thereby forming the rectifying contact between the field plate electrode and the electric reference potential, whose characteristics of direct driving voltage and series resistance and capacitance are determined by the number and by the geometries of the chosen junctions and resistive elements.

3. The high electron mobility transistor according to claim 1, wherein the first and second current conductive electrodes are source and drain electrodes, respectively, the control gate is formed adjacent to the source electrode, and the field plate electrode is formed adjacent to the drain electrode.

4. The high electron mobility transistor according to claim 1, wherein the control gate comprises:
    an upper portion formed to extend outside the mechanical protection and/or passivation layer and comprising:

a first portion formed to extend laterally on the mechanical protection and/or passivation layer, so as to rest on, and be mechanically supported by, the latter; and a second portion formed to be vertically spaced apart from, and laterally extending from either one or both of the sides of, the first portion.

5. The high electron mobility transistor according to claim 4, further comprising:

a first window and a second window formed in the mechanical protection and/or passivation layer to expose respective surfaces of the barrier layer;

wherein the control gate further comprises:

a lower portion formed on one of the exposed surfaces of the barrier layer to form a Schottky junction therewith, and of such a thickness as to fail to protrude from the mechanical protection and/or passivation layer; the upper portion of the gate electrode being formed on, and in electric contact with, the lower portion, to protrude from the mechanical protection and/or passivation layer;

and wherein the field plate electrode comprises:

only a lower portion formed on the other of the exposed surfaces of the barrier layer to either form also a Schottky junction with the barrier layer and to fail to protrude from the mechanical protection and/or passivation layer, or, alternatively, formed on the mechanical protection and/or passivation layer.

6. The high electron mobility transistor according to claim 5, wherein the lower portions of the control gate and of the field plate electrode are formed by selective deposition, by means of a lift-off process, of a metallization comprising one or more metallic elements.

7. An integrated semiconductor device comprising:
a high electron mobility transistor as claimed in claim 1;
and at least one of:
a high electron mobility transistor comprising:
an epitaxial substrate comprising a semi-insulating substrate, a buffer layer, and a barrier layer sequentially stacked,
a mechanical protection and/or passivation layer formed on the barrier layer, and
one or more Metal-Insulator-Semiconductor control gates formed on the mechanical and/or passivation protection layer; and
a high electron mobility transistor comprising:
an epitaxial substrate comprising a semi-insulating substrate, a buffer layer, and a barrier layer sequentially stacked,
a mechanical protection and/or passivation layer formed on the barrier layer, and
one or more Schottky control gates formed on respective exposed surfaces of the barrier layer.

8. A process of manufacturing a high electron mobility transistor, comprising:

providing an epitaxial substrate comprising a semi-insulating substrate, a buffer layer, and a barrier layer sequentially stacked;

forming a mechanical protection and/or passivation layer on the barrier layer, and forming first and second current conductive electrodes on the barrier layer; and forming a control gate and a field plate electrode on the barrier layer, between the first and second current conductive electrodes;

characterized by:

forming an electric circuit to electrically connect the field plate electrode to an electric reference potential, and comprising at least one rectifying contact formed outside a channel area of the high electron mobility transistor and distinct from a rectifying contact defined by a Schottky junction that includes the field plate electrode.

9. The manufacturing process according to claim 8, wherein forming the electric circuit comprises:

forming an electrically non-conducting area in the barrier layer, outside an electrically conducting area in which the high electron mobility transistor is formed; and forming in the electrically non-conducting area of the barrier layer an electrically conductive strip of semiconductor material having an electric resistance depending on geometric dimensions and resistivity of the semiconductor material; the electrically conductive strip having a first end electrically connected, via an ohmic contact, to the reference electric potential and/or to another electrically conductive strip, and a second end connected to at least one Schottky junction, thereby forming the rectifying contact between the field plate electrode and the electric reference potential, whose characteristics of direct driving voltage and series resistance and capacitance are determined by the number and by the geometries of the chosen junctions and resistive elements.

10. The manufacturing process according to claim 8, wherein the first and second current conductive electrodes are source and drain electrodes, respectively, the control gate is formed adjacent to the source electrode, and the field plate electrode is formed adjacent to the drain electrode.

11. The manufacturing process according to claim 8, wherein forming the control gate comprises:

forming an upper portion extending outside the mechanical protection and/or passivation layer and comprising:

a first portion extending laterally on the mechanical protection and/or passivation layer, so as to rest on, and be mechanically supported by, the latter; and a second portion vertically spaced apart from, and laterally extending from either one or both of the sides of, the first portion.

12. The manufacturing process according to claim 11, further comprising:

forming a first window and a second window in the mechanical protection and/or passivation layer to expose respective surfaces of the barrier layer;

wherein forming the control gate further comprises:

forming a lower portion on one of the exposed surfaces of the barrier layer to form a Schottky junction therewith, and of such a thickness as to fail to protrude from the mechanical protection and/or passivation layer; the upper portion of the gate electrode being formed on, and in electric contact with, the lower portion, to protrude from the mechanical protection and/or passivation layer;

and wherein forming the field plate electrode comprises:

forming only a lower portion on the other of the exposed surfaces of the barrier layer by exploiting the same deposition by means of which the lower portion of the gate electrode, to either form also a Schottky junction with the barrier layer and to fail to protrude from the mechanical protection and/or passivation layer, or, alternatively, formed on the mechanical protection and/or passivation layer.

13. The manufacturing process according to claim 12, wherein the lower portions of the control gate and of the field plate electrodes are formed simultaneously by the same selective deposition, by means of a lift-off process, of a metallization comprising one or more metallic elements.

14. A process of manufacturing an integrated semiconductor device, comprising:
(a) manufacturing a high electron mobility electron transistor by:
providing an epitaxial substrate comprising a semi-insulating substrate, a buffer layer, and a barrier layer sequentially stacked,
forming a mechanical protection and/or passivation layer on the barrier layer, and
forming first and second current conductive electrodes on the barrier layer,
forming a control gate and a field plate electrode on the barrier layer, between the first and second current conductive electrodes, and
forming an electric circuit to electrically connect the field plate electrode to an electric reference potential, and comprising at least one rectifying contact formed outside a channel area of the high electron mobility transistor and distinct from the rectifying contact defined by the Schottky junction including the field plate electrode;
and comprising one of:
(b) manufacturing the high electron mobility transistor further comprising:
the epitaxial substrate comprising the semi-insulating substrate, the buffer layer, and the barrier layer sequentially stacked,
the mechanical protection and/or passivation layer formed on the barrier layer, and
one or more Metal-Insulator-Semiconductor control gates formed on the mechanical and/or passivation protection layer by:
forming an upper portion extending outside the mechanical protection and/or passivation layer and comprising:
a first portion extending laterally on the mechanical protection and/or passivation layer, so as to rest on, and be mechanically supported by, the latter; and
a second portion vertically spaced apart from, and laterally extending from either one or both of the sides of, the first portion; or
(c) manufacturing the high electron mobility transistor further comprising:
the epitaxial substrate comprising the semi-insulating substrate, the buffer layer, and the barrier layer sequentially stacked,
the mechanical protection and/or passivation layer formed on the barrier layer, and
one or more Schottky control gates formed on respective exposed surfaces of the barrier layer by exploiting the same deposition by:
forming a first window and a second window in the mechanical protection and/or passivation layer to expose respective surfaces of the barrier layer;
wherein forming the control gate further comprises:
forming a lower portion on one of the exposed surfaces of the barrier layer to form a Schottky junction therewith, and of such a thickness as to fail to protrude from the mechanical protection and/or passivation layer; the upper portion of the gate electrode being formed on, and in electric contact with, the lower portion, to protrude from the mechanical protection and/or passivation layer;
and wherein forming the field plate electrode comprises:
forming only a lower portion on the other of the exposed surfaces of the barrier layer by exploiting the same deposition by means of which the lower portion of the gate electrode, to either form also a Schottky junction with the barrier layer and to fail to protrude from the mechanical protection and/or passivation layer, or, alternatively, formed on the mechanical protection and/or passivation layer.

15. A high electron mobility transistor comprising:
an epitaxial substrate comprising a semi-insulating substrate, a buffer layer, and a barrier layer sequentially stacked;
a mechanical protection and/or passivation layer formed on the barrier layer, and
first and second current conductive electrodes formed on the barrier layer; and
a control gate and two or more field plate electrodes formed on the barrier layer or on the mechanical protection and/or passivation layer, between the first and second current conductive electrodes;
characterized by:
an electric circuit formed to electrically connect each of the two or more field plate electrodes to an electric reference potential, and comprising at least one rectifying contact formed outside a channel area of the high electron mobility transistor and distinct from a rectifying contact defined by a Schottky junction that includes a particular field plate electrode.

16. The high electron mobility transistor according to claim 15, wherein:
the barrier layer comprises an electrically conducting area in which the high electron mobility transistor is formed, and an electrically non-conducting area formed outside the electrically conducting area;
and wherein the electric circuit comprises:
an electrically conductive strip of semiconductor material formed in the electrically non-conducting area of the barrier layer and having an electric resistance depending on geometric dimensions and resistivity of the semiconductor material; the electrically conductive strip having a first end electrically connected, via an ohmic contact, to the reference electric potential and/or to another electrically conductive strip, and a second end connected to at least one Schottky junction, thereby forming the rectifying contact between the particular field plate electrode and the electric reference potential, whose characteristics of direct driving voltage and series resistance and capacitance are determined by the number and by the geometries of the chosen junctions and resistive elements.

17. The high electron mobility transistor according to claim 15, wherein the first and second current conductive electrodes are source and drain electrodes, respectively, the control gate is formed adjacent to the source electrode, and the particular field plate electrode is formed adjacent to the drain electrode.

18. The high electron mobility transistor according to claim 15, wherein the control gate comprises:
an upper portion formed to extend outside the mechanical protection and/or passivation layer and comprising:
a first portion formed to extend laterally on the mechanical protection and/or passivation layer, so as to rest on, and be mechanically supported by, the latter; and
a second portion formed to be vertically spaced apart from, and laterally extending from either one or both of the sides of, the first portion.

19. The high electron mobility transistor according to claim 18, further comprising:
a first window and a second window formed in the mechanical protection and/or passivation layer to expose respective surfaces of the barrier layer;
wherein the control gate further comprises:
a lower portion formed on one of the exposed surfaces of the barrier layer to form a Schottky junction therewith, and of such a thickness as to fail to protrude from the mechanical protection and/or passivation layer; the upper portion of the gate electrode being formed on, and in electric contact with, the lower portion, to protrude from the mechanical protection and/or passivation layer;
and wherein the particular field plate electrodes comprise:
only a lower portion formed on the other of the exposed surfaces of the barrier layer to either form also a Schottky junction with the barrier layer and to fail to protrude from the mechanical protection and/or passivation layer, or, alternatively, formed on the mechanical protection and/or passivation layer.

20. The high electron mobility transistor according to claim 19, wherein the lower portions of the control gate and of the two or more field plate electrodes are formed by selective deposition, by means of a lift-off process, of a metallization comprising one or more metallic elements.

21. An integrated semiconductor device comprising:
a high electron mobility transistor as claimed in claim 15;
and at least one of:
a high electron mobility transistor comprising:
an epitaxial substrate comprising a semi-insulating substrate, a buffer layer, and a barrier layer sequentially stacked,
a mechanical protection and/or passivation layer formed on the barrier layer, and
one or more Metal-Insulator-Semiconductor control gates formed on the mechanical and/or passivation protection layer; and
a high electron mobility transistor comprising:
an epitaxial substrate comprising a semi-insulating substrate, a buffer layer, and a barrier layer sequentially stacked,
a mechanical protection and/or passivation layer formed on the barrier layer, and
one or more Schottky control gates formed on respective exposed surfaces of the barrier layer.

22. A process of manufacturing an integrated semiconductor device, comprising:
(a) manufacturing a high electron mobility electron transistor by:
providing an epitaxial substrate comprising a semi-insulating substrate, a buffer layer, and a barrier layer sequentially stacked,
forming a mechanical protection and/or passivation layer on the barrier layer, and
forming first and second current conductive electrodes on the barrier layer,
forming a control gate and two or more field plate electrodes on the barrier layer or on the mechanical protection and/or passivation layer, between the first and second current conductive electrodes, and
forming an electric circuit to electrically connect each field plate electrode to an electric reference potential, and comprising at least one rectifying contact formed outside a channel area of the high electron mobility transistor and distinct from the rectifying contact defined by the Schottky junction including a particular field plate electrode;
and comprising one of:
(b) manufacturing the high electron mobility transistor further comprising:
the epitaxial substrate comprising the semi-insulating substrate, the buffer layer, and the barrier layer sequentially stacked,
the mechanical protection and/or passivation layer formed on the barrier layer, and
one or more Metal-Insulator-Semiconductor control gates formed on the mechanical and/or passivation protection layer by:
forming an upper portion extending outside the mechanical protection and/or passivation layer and comprising:
a first portion extending laterally on the mechanical protection and/or passivation layer, so as to rest on, and be mechanically supported by, the latter; and
a second portion vertically spaced apart from, and laterally extending from either one or both of the sides of, the first portion; or
(c) manufacturing the high electron mobility transistor further comprising:
the epitaxial substrate comprising the semi-insulating substrate, the buffer layer, and the barrier layer sequentially stacked,
the mechanical protection and/or passivation layer formed on the barrier layer, and
one or more Schottky control gates formed on respective exposed surfaces of the barrier layer by exploiting the same deposition by:
forming a first window and a second window in the mechanical protection and/or passivation layer to expose respective surfaces of the barrier layer;
wherein forming the control gate further comprises:
forming a lower portion on one of the exposed surfaces of the barrier layer to form a Schottky junction therewith, and of such a thickness as to fail to protrude from the mechanical protection and/or passivation layer; the upper portion of the gate electrode being formed on, and in electric contact with, the lower portion, to protrude from the mechanical protection and/or passivation layer;
and wherein forming the particular field plate electrode comprises:
forming only a lower portion on the other of the exposed surfaces of the barrier layer by exploiting the same deposition by means of which the lower portion of the gate electrode, to either form also a Schottky junction with the barrier layer and to fail to protrude from the mechanical protection and/or passivation layer, or, alternatively, formed on the mechanical protection and/or passivation layer.

* * * * *